United States Patent
Fayneh et al.

(10) Patent No.: US 6,894,569 B2
(45) Date of Patent: May 17, 2005

(54) HIGH-PERFORMANCE CHARGE PUMP FOR SELF-BIASED PHASE-LOCKED LOOP

(75) Inventors: Eyal Fayneh, Givatayim (IL); Ernest Knoll, Haifa (IL)

(73) Assignee: Intel Corporation, Santa Clara, CA (US)

( * ) Notice: Subject to any disclaimer, the term of this patent is extended or adjusted under 35 U.S.C. 154(b) by 162 days.

(21) Appl. No.: 10/330,556

(22) Filed: Dec. 30, 2002

(65) Prior Publication Data

US 2004/0124935 A1 Jul. 1, 2004

(51) Int. Cl.[7] .................................................. H03L 7/00
(52) U.S. Cl. ........................... 331/16; 331/17; 327/157
(58) Field of Search .............................. 331/16, 17, 15, 331/8, 10, 25; 327/157, 159, 148, 534, 536

(56) References Cited

U.S. PATENT DOCUMENTS

| | | | | |
|---|---|---|---|---|
| 5,740,213 A | * | 4/1998 | Dreyer | 375/374 |
| 5,870,003 A | * | 2/1999 | Boerstler | 331/17 |
| 6,107,849 A | * | 8/2000 | Williams et al. | 327/157 |
| 6,229,362 B1 | * | 5/2001 | Choi | 327/157 |
| 6,329,882 B1 | | 12/2001 | Fayneh et al. | 331/10 |
| 2001/0013801 A1 | * | 8/2001 | Johnson | 327/157 |

* cited by examiner

Primary Examiner—Joseph Chang
(74) Attorney, Agent, or Firm—Fleshner & Kim, LLP

(57) ABSTRACT

A charge pump includes a charge circuit switch, a pump circuit switch, and a controller for generating a first control signal for switching the charge circuit switch and a second control signal for switching the pump circuit. In order to reduce the effects of self-jitter and improve signal quality, the controller generates the first and second control signals so that they have a same amplitude and slew rate. This results in improving steady-state phase error (DC skew). To further improve performance, current sources of the charge pump are controlled to operate continuously. This advantageously minimizes parasitic switching currents. The charge pump may be incorporated within a phase-locked loop for purposes of generating frequency signals. The phase-locked loop may be self-biased. A processing system having, for example, a microprocessor-based computing architecture may advantageously include the phase-locked loop for performing any one of a variety of applications.

42 Claims, 10 Drawing Sheets

HIGH-PERFORMANCE CHARGE PUMP FOR SELF-BIASED PHASE-LOCKED LOOP

BACKGROUND OF THE INVENTION

1. Field of the Invention

This invention relates to a system and method for generating signals for adjusting the output frequency of an oscillation circuit such as a phase-locked loop.

2. Description of the Related Art

FIG. 1 shows a charge pump used in a conventional phase-locked loop. The charge pump includes an output stage 1 and a control stage 2. The output stage contains a differential arrangement of transistors Q1–Q4. Transistors Q2 and Q10 are the UP and DN current sources. Transistor Q2 is a switched current source, while transistors Q3 and Q4 implement the current switch for the Q10 current source. Transistor Q1 is the active load of the left branch in the differential structure. The gates of transistors Q2–Q4 are controlled by outputs of the control stage. A node N1 located between transistors Q2 and Q4 outputs source current $I_{charge}$ to and sinks current $I_{pump}$ from capacitor C1 of the loop filter. Sourcing or sinking this current for a time period proportional to the width of a control voltage pulse output from the charge pump causes the PLL to output a frequency signal that reduces the difference in phase between the reference and feedback signals.

The control stage 2 includes two input buffers B1 and B2 and transistors Q5–Q9. The buffers receive Up and Down signals and their complements (Up, Dn, Up#, Dn#) from the phase-frequency detector and output a corresponding In signal and its complement In# to control switching of the transistors in the output stage. When the left branch (Q5–Q7) is activated, the signal $V_{ch}$ from its Out# terminal swings DN (see FIG. 2) and controls the output of charge current $I_{charge}$ to the loop filter. Buffer B2 directly outputs a down current source (pump) switching signal $V_{pm}$ to transistor Q4 for controlling the sinking of current $I_{pump}$ into node N1. The charge circuit, thus, has no dedicated switch (the "charge" current source is switched on and off) while the pump circuit has a dedicated switch (one directly controlled by the Dn/Dn# outputs of buffer B2). Transistors Q9 and Q10 receive a signal nbias for biasing the charge pump to a desired current value.

The conventional circuit described above generates charge and pump currents using switching signals that have different amplitudes and slew rates. Switching signal $V_{ch}$ is a low swing, slow slew rate signal having an amplitude determined by the PLL bias operating point. At low bias (low frequency), the amplitude is low and close to the threshold voltage of the P transistor Q2. At high bias (high frequency), the amplitude of $V_{ch}$ is increased. FIG. 2 shows these aspects of $V_{ch}$, where curve A has a gradual slope indicative of a slow slew rate and an amplitude equal to the difference between $V_{cc}$ and $V_{cntrl}$. In contrast to $V_{ch}$, the down current (or pump) switching signal $V_{pm}$ is a full rail, fast switching signal. This is evident from curve B in FIG. 3 which has a steep slope and an amplitude equal to the difference between $V_{cc}$ and Vss. Using switching signals $V_{ch}$ and $V_{pm}$ with different amplitudes and slew rates produces the following undesirable effects.

First, when a small phase error is input into the phase-frequency detector, the CHARGE state of the charge pump vanishes. Because the charge current source is switched by a slow, low swing analog signal ($V_{ch}$), the charge circuit will not generate current at a sufficiently fast rate. As a result, the charge current $I_{cp}$ will be injected into the loop filter after the charge pump transitions to the OFF state. The charge current injected into the loop filter will therefore not look like a current pulse and thus the VCO output will not be controlled in the desired manner.

Second, parasitic switching currents (due to parasitic capacitances $C_{gd}$ of the p-channel transistor Q2 of the n-channel transistor Q4) will flow to and from the loop filter capacitor C1 and affect the average charge pump current to zero for a non-zero input phase error. In a self-biased PLL such as shown in FIG. 4, the switching currents of the CP1 output stage are induced to the loop filter capacitor (C1), while the switching currents of the CP2 output stage are induced into the loop filter resistor. They generate spikes on $V_1$ and $V_{cntl}$, thereby affecting the VCO frequency. This VCO frequency is the self-jitter of the PLL due to reference feed-through modulation. Techniques for implementing a self-biased PLL are disclosed in U.S. Pat. No. 6,329,882.

FIG. 5 shows the output current pulse produced by the conventional charge pump of FIG. 1 with zero phase error at the phase/frequency detector input. At zero phase error, the average of the output current should be zero. However, in FIG. 5, the average output current is not zero. The average current will be zeroed for a certain phase error, i.e., the PLL DC skew. Moreover, the output current appears as a high spike (Region A) indicative of instantaneous (feed-through) jitter.

The current waveform of FIG. 5 further indicates that the charge pump does not operate in a proper manner. For example, at zero phase error, the charge pump should work in OVERLAP mode. In this mode, both UP and DN current sources must be opened and thus the net current injected in capacitor C1 should be zero. However, as shown in FIG. 5, in the conventional circuit the UP current source opens late (Region B), i.e., at this point the UP current source should already be off.

The current waveform of FIG. 5 further shows that the switching currents through parasitic capacitors are high, and (due to differences in amplitude and slew rate of the controls) unequal. The net current due to these "parasitic" currents also have a major effect on the DC skew. More specifically, DC skew may be caused by two factors. First, because the charge pump does not operate correctly in OVERLAP mode, the contributions of the Up and Dn current sources are not equal, which results in a non-zero average. Second, the parasitic switching currents are not equal and do not cancel each other (due to non-equal amplitudes and slew rates of the control signals). Variance in process, temperature, and operating point results from these effects.

More specifically, since the amplitude of the $V_{ch}$ control signal is dependent on the bias operating point (that is, a function of operating frequency), temperature, and process, the net current injected into capacitor C1 (and thus the PLL DC skew) will highly vary with process, temperature, and operating frequency. (In the conventional circuit, the DC skew variation is typically 80 ps). The current spikes (which correspond to parasitic currents at Region A and point C) of CP2 determine voltage spikes on the loop filter resistor R, affecting the instantaneous VCO frequency (feed-through jitter).

In view of the foregoing considerations, it is clear that a need exists for an improved charge pump which may be implemented in a phase-locked loop, and more specifically one which does not realize the disadvantages of the conventional charge pump previously described.

DESCRIPTION OF THE PREFERRED EMBODIMENTS

The present invention is implemented in various forms for generating control signals in a processing system. The control signals may be used to adjust the frequency of an oscillation circuit such as a phase-locked loop. However, those skilled in the art can appreciate that the control signals generated by the present invention are not necessarily limited to this application. Rather, the invention may be more broadly applied to generate signals for driving and/or controlling any number of elements in a processing system, and as such may correspond to generating clock signals and timing signals in addition to controlling the frequency of an oscillation circuit.

Figure 6:
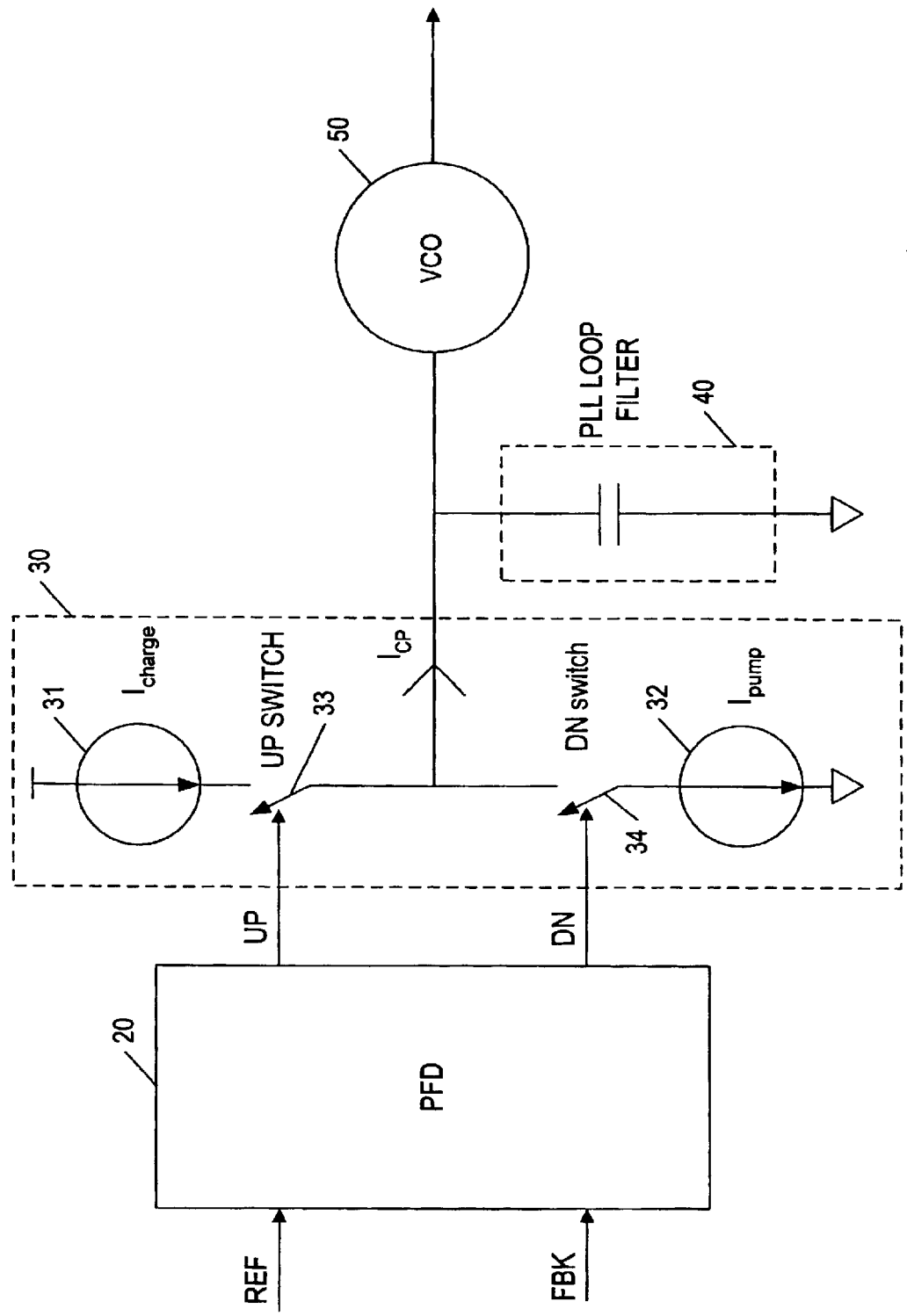
FIG. 6 is a diagram showing a phase/frequency detector driving an ideal charge pump.

FIG. 6 is a diagram showing a phase-frequency detector circuit for driving an ideal charge pump, which includes a phase-frequency detector 20, a charge pump 30, a loop filter 40, and a voltage-controlled oscillator 50. The phase-frequency detector compares a reference signal REF and a feedback signal FBK to determine whether a frequency and/or phase difference exists between them. The feedback signal may directly correspond to the output of the voltage-controlled oscillator or may constitute a divided version of this output, achieved by placing a divider circuit in a feedback path connecting the VCO and phase-frequency detector. The charge pump includes a charge current source 31 which outputs a charge (or source) current $I_{charge}$ to the loop filter and a pump current source 32 which sinks current $I_{pump}$ from the loop filter. The charge current source may be a positive current source and the pump current source a negative current source. The symbol $I_{cp}$ is shown as being the current output from the charge pump and the loop filter is shown as including a capacitor 40. (It is noted that this figure illustrates how an ideal charge pump works. The present invention implements a new charge pump circuit that is much closer to the ideal functionality than conventional circuits. An explanation of the operation of the circuit of the present invention will now be provided.)

In operation, the phase-frequency detector determines whether a phase (or frequency) difference exists between the reference and feedback signals. If a difference exists, the detector outputs one of an Up signal and a Down signal to control the output of the charge pump. If the phase of the reference signal leads the phase of the feedback signal, the Up signal may be asserted. In this case, switch 33 will close and the current signal output from the charge pump will correspond to the output of current source 31, e.g., $I_{cp}=I_{charge}$. Conversely, if the phase of the reference signal lags the phase of the feedback signal, switch 34 will close and the Down signal may be asserted. In this case, the current signal output from the charge pump will correspond to the output of current source 32, e.g., $I_{cp}=I_{pump}$. Which signal is asserted depends on the phase/frequency relation between the reference and feedback signals.

The amount of time current is supplied to or sinked from the loop filter corresponds to the width of the pulse of $I_{cp}$. Since the width of this pulse is proportional to the phase/frequency difference between the reference and feedback signals, the capacitor in the loop filter will be charged/discharged for an amount of time that will bring the phases of these signals into coincidence. The resulting signal output from the loop filter will therefore control the VCO to output a signal at a frequency and a phase which is not substantially different from the reference signal input into the phase-frequency detector. This process (VCO phase correction) may take several iterations (phase comparisons) until settling upon zero error.

Figure 7:
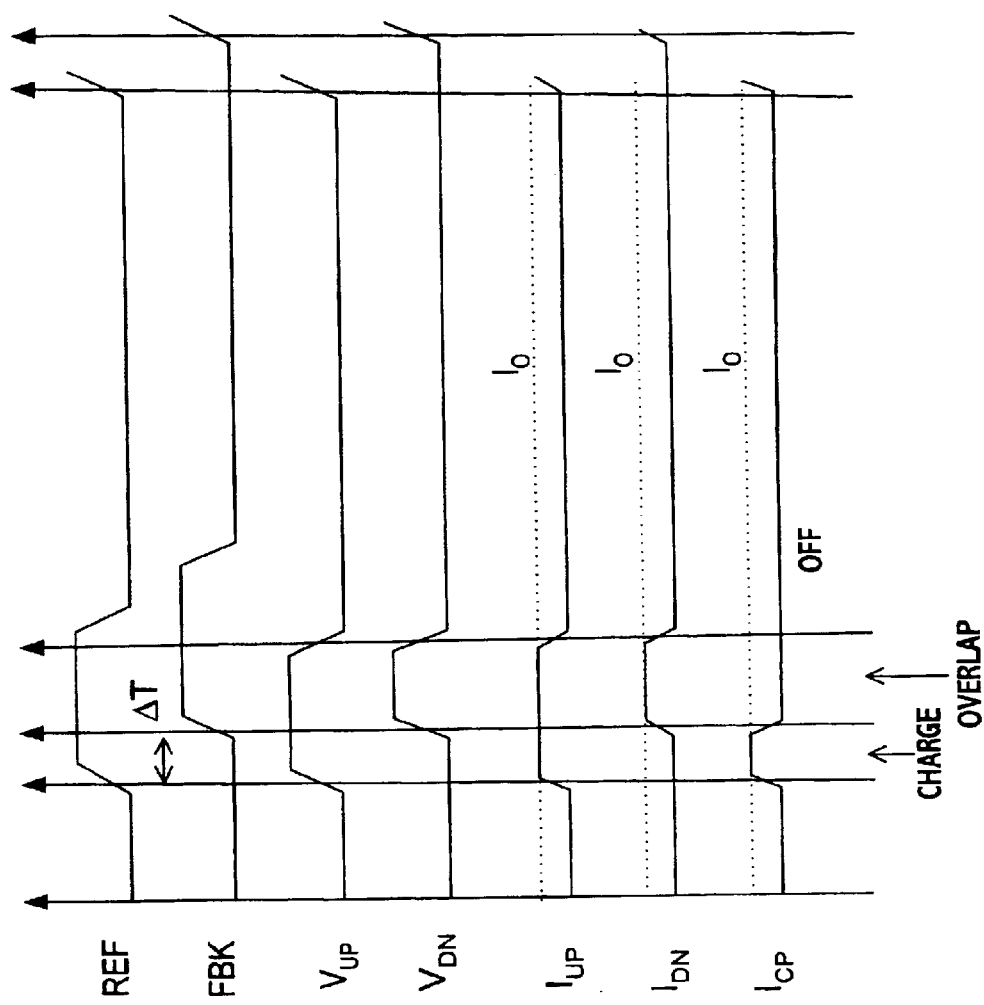
FIG. 7 is a diagram showing waveforms for operation of the ideal charge pump of FIG. 6.

FIG. 7 is a timing diagram showing different modes of operation of the ideal charge pump described above. This diagram includes voltage waveforms REF and FBK for the reference and feedback voltages that are input into the phase-frequency detector and voltages $V_{Up}$ and $V_{Dn}$ which are used to switch the outputs of Up and Down current sources 31 and 32 respectively. The timing diagram also includes three current waveforms, one for charge current $I_{Up}$ output from current source 31 when switched by voltage signal $V_{up}$, one for charge current $I_{Down}$ output from current source 32 when switched by voltage signal $V_{Dn}$, and one for the current signal $I_{cp}$ output from the charge pump.

The charge pump operates in one of four modes.

In CHARGE mode, a rising edge of the reference signal REF appears at the input of the phase-frequency detector. At this time, the detector outputs a switching voltage signal to the charge pump as shown by the rising edge of $V_{up}$. This signal closes the Up switch to cause the charge pump to output charge current $I_{up}$ such that $I_{cp}=I_{up}$. In this mode, the charge pump therefore drives current into the loop filter of the PLL.

In PUMP mode, a rising edge of the feedback signal FBK signal appears at the input of the phase-frequency detector. At this time, the detector outputs a switching voltage signal $V_{Dn}$ to the charge pump as shown by the rising edge of $V_{Dn}$. This signal closes the Dn switch to cause the charge pump to sink current from the loop filter of the phase locked loop equal to $I_{Dn}$.

In OVERLAP mode, the rising edge of the reference signal is input into the phase-frequency detector at the same time the charge pump is operating in pump mode (i.e., the Dn switch is closed). Because both the Up switch and Dn switch are closed at this time, $I_{up}$ current from the charge current source flows into the down (or pump) current source. As a result, no current will flow out of or into the charge pump during this mode. OVERLAP mode may also occur if the charge pump is operating in charge mode at the same time the rising edge of the feedback signal is input into the phase-frequency detector. This will cause the phase-frequency detector to assert the Dn switching signal, $V_{Dn}$, and thus close the Dn switch. In either case, the charge pump current $I_{cp}$ will assume a value of zero.

In OFF mode, the Up and Dn switches are both opened. As a result, the current sources of the charge pump are disconnected from the loop filter and no current will flow to or from the loop filter.

The operation of the phase-locked loop may therefore be summarized as follows. When the phase-frequency detector detects a phase difference between the reference and feedback signals, the charge pump outputs a current pulse having a width (duration) equal to the phase difference. The current pulse determines a voltage variation at the loop filter output. This variation is proportional to the current pulse width and thus determines a VCO steering line voltage change which produces a VCO frequency shift that corrects the phase difference.

Under ideal conditions, when the phase difference between the reference and feedback signals is zero, the current pulse width and average charge pump output current are zero and no correction occurs in the loop. However, under non-ideal (or practical) conditions, the average current output from the charge pump is zeroed for a non-zero phase difference. The non-zero phase difference which exists under this conditions is referred to as steady state DC skew of the phase-locked loop (PLL).

Figure 8:
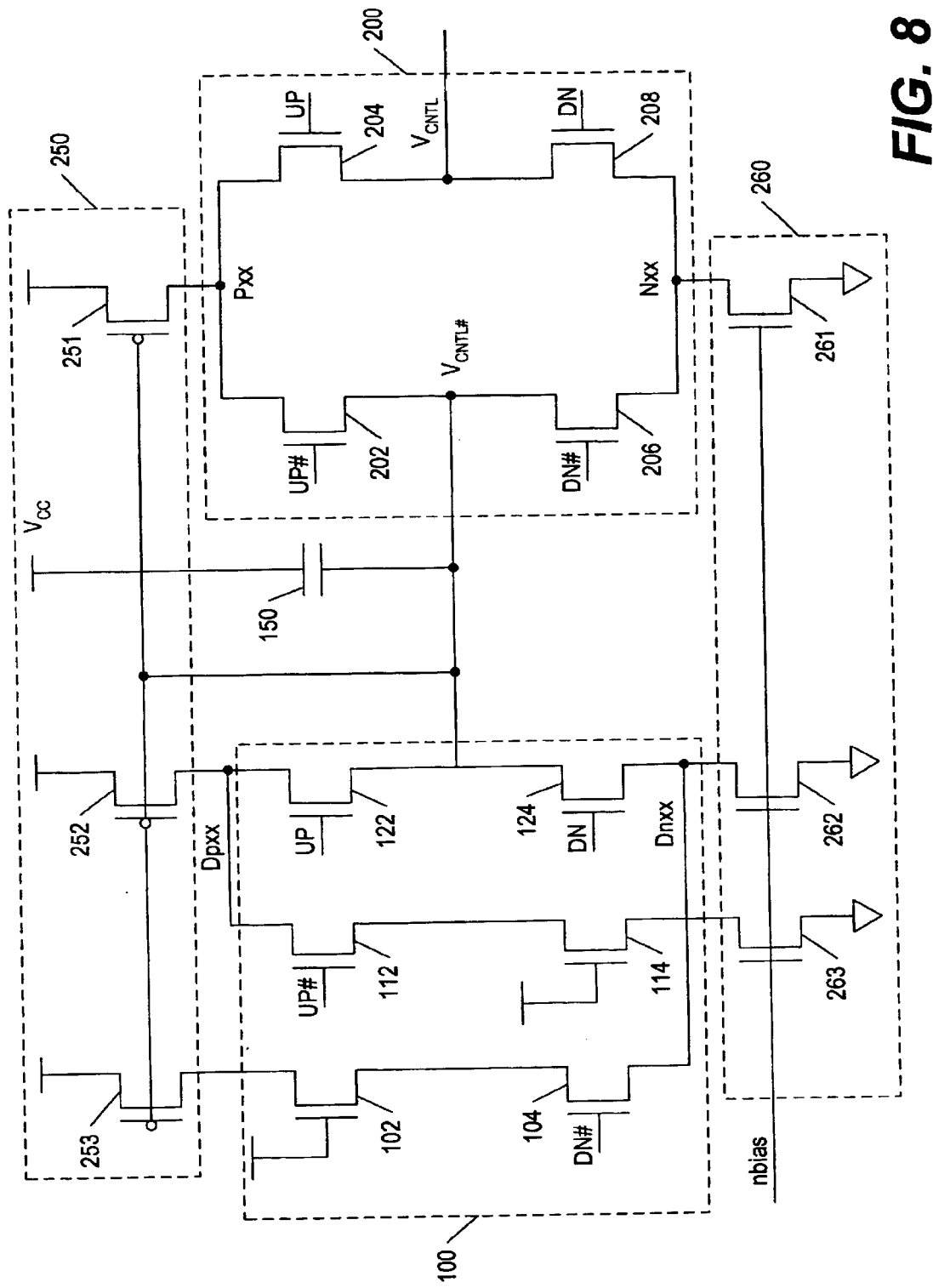
FIG. 8 is a diagram showing a charge pump in accordance with one embodiment of the present invention

FIG. 8 shows a charge pump circuit in accordance with an embodiment of the present invention. This circuit includes a dummy stage 100, a capacitor 150, and an output stage 200. The dummy stage includes a first pair of connected transistors 102 and 104, a second pair of connected transistors 112 and 114, and a third pair of connected transistors 122 and 124. The gates of transistors 102 and 114 are connected to a voltage source and therefore these transistors are always switched on. The gates of transistors 104, 112, 122, and 124 are respectively switched by signals Dn#, Up#, Up, and Dn output from the phase-frequency detector of the PLL. Preferably, the signals are buffered in a CMOS buffer prior to input into the dummy stage to provide equal slew rates. Capacitor 150 is connected between $V_{cntl}$# and $V_{cc}$. Also, $V_{cntl}$# is connected to the gates of the 3 P transistors of the current source 250 (namely transistors 251, 252, and 253). The capacitor is preferably included to avoid changes in $V_{cntl}$# while the Up/Up# and Dn/Dn# signals are toggling.

The output stage includes a symmetrical arrangement of four transistors 202, 204, 206, and 208. The transistors are connected to respectively form charge and pump switch circuits of the charge pump. P transistor current source 250 and N transistor switch 204 are included in the charge circuit and N transistor current source 260 and N transistor switch 208 are included in the pump circuit. The N transistor current source may be biased to a desired current level by signal nbias. The transistors in the output stage are switched by the Up and Dn signals and their complements output from the phase-frequency detector, via the CMOS buffer, to generate a control voltage $V_{cntl}$ which corrects the frequency of a VCO to reduce or eliminate a phase difference between reference and feedback signals of a PLL. The Up and Dn signals and their complements are buffered in a CMOS buffer prior to input into the dummy stage, and the amplitudes of switching signals Up, Up#, Dn, and Dn# are equal to a circuit supply voltage Vcc. (The CMOS buffer ensures equal slew rates as well).

Operation of the output stage of the charge pump will now be described for each mode of operation of the charge pump.

In CHARGE mode, Up is high, Dn is low, Up# is low, and Dn# is high. These signals cause transistors 204 and 206 to be switched on and transistors 202 and 208 to be switched off. As a result, current from source 251 flows through node Pxx and transistor 204 to the $V_{cntl}$ output, and current from current source 252 flows through switch 122 of the dummy stage and then through transistor 206 to node Nxx and current source 261. Dummy current from current source 253 flows through transistors 102 and 104 and node Dnxx to the current source 263.

In PUMP mode, Up is low, Dn is high, Up# is high, and Dn# is low. These signals cause transistors 202 and 208 to be switched on and transistors 204 and 206 to be switched off. As a result, transistor 208 causes current to be sinked from $V_{cntl}$ through node Nxx to the current source 261. Transistor 202 drives current from current source 262 and transistor 124 of the dummy stage through node Pxx to current source 251. Dummy current from current source 252 flows through node Dpxx and transistors 112 and 114 to current source 263.

In OVERLAP mode, Up is high, Dn is high Up# is low, and Dn# is low. These signals cause transistors 204 and 208 to be switched on and transistors 202 and 206 to be switched off. As a result, current flows from current source 251, through node Pxx, transistors 204 and 208, and node Nxx to current source 261. No current goes to the $V_{cntl}$ output and no current flows from the dummy stage to the output stage. Dummy current from current source 252 flows through node Dpxx, transistors 122 and 124 and node Dnxx to current source 262.

In OFF mode, Up and Dn are low and Up# and Dn# are high. These signals cause transistors 202 and 206 to be switched on and transistors 204 and 208 to be switched off. As a result, current from source 251 flows through node Pxx, transistors 202 and 206, and node Nxx to current source 261. No current flows from the dummy stage to the output stage. Dummy current from current source 252 flows through node Dpxx and transistors 112 and 114 to current source 263, while dummy current from current source 262 flows through node Dnxx and transistors 104 and 102 from current source 253.

From the foregoing, it is clear that current sources 251 and 261 are continuously operating. Further, the currents are switched between the right branch (transistors 204 and 208) and the left branch (transistors 202 and 206) of the output stage. In some operating modes, the continuity of the current is provided by the dummy stage. Because current sources 251, 252 and 261, 262 are always on and their currents are directed to one of the two branches in the output stage (depending on the charge pump operating mode) and the dummy stage respectively, the current switching processes are fast, making the charge pump operate much closer to the operation of an ideal charge pump. Also, due to the continuous operation of current sources 251, 252 and 261, 262, the voltages at nodes Nxx, Dnxx, Pxx, and Dpxx are kept constant and smooth (no spikes or ripples appear during CP switching) in all operating modes of the charge pump. These voltages may vary with the PLL operating point.

Another beneficial factor in keeping the voltages at nodes Pxx and Nxx smooth and the current flowing through these nodes constant relates to the opposite manner in which the transistors connected to these nodes are switched. More specifically, the switches connected to node Pxx (transistors 202 and 204), as well as the switches connected to node Nxx (transistors 206 and 208), are always switched in opposite directions, e.g., transistor 202 is controlled by Up# while transistor 204 is controlled by Up. Thus, when transistor 202 is switched on, transistor 204 is switched off and vice versa. For node Nxx, transistor 206 is controlled by Dn# and transistor 208 is controlled by Dn. Thus, when transistor 206 is switched on, transistor 208 is switched off and vice versa. Switching switches 206 and 208 for node Nxx and switches 202 and 204 for node Pxx in opposite directions advantageously causes parasitic switching currents (that are simultaneous and equal but in opposite directions) to be cancelled, which operates to keep the current of the output stage constant.

Figure 1:
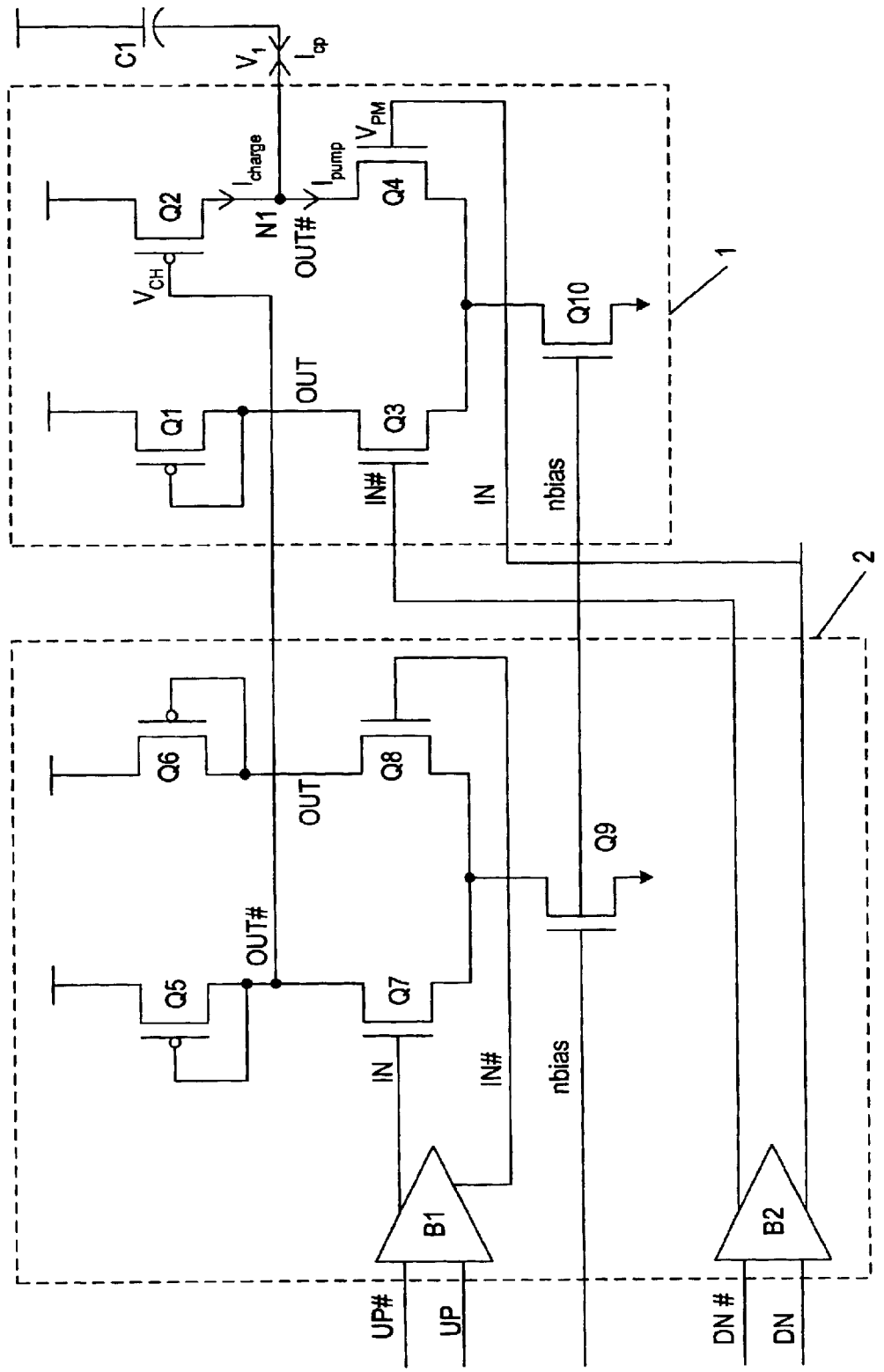
FIG. 1 is a diagram showing a conventional charge pump circuit.
Figure 2:
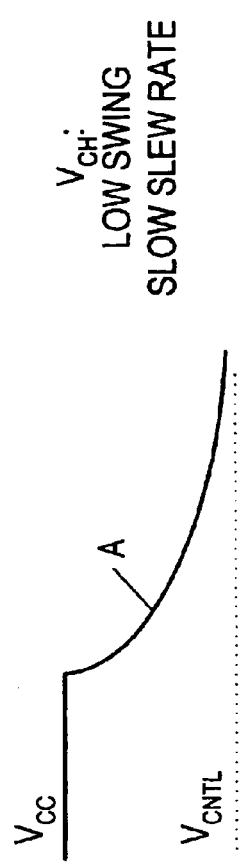
FIG. 2 is a diagram showing the amplitude and slew rate of a switching signal for controlling a charge circuit of the charge pump shown in FIG. 1.
Figure 3:
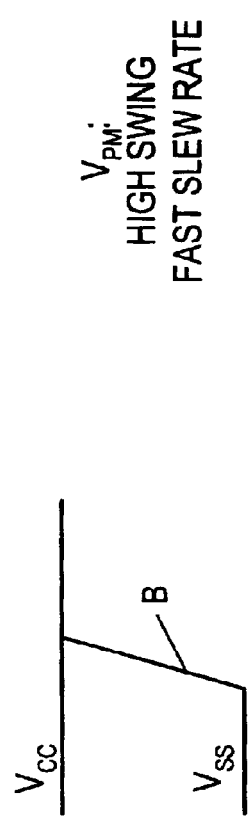
FIG. 3 is a diagram showing the amplitude and slew rate of a switching signal for controlling a pump circuit of the charge pump shown in FIG. 1.
Figure 4:
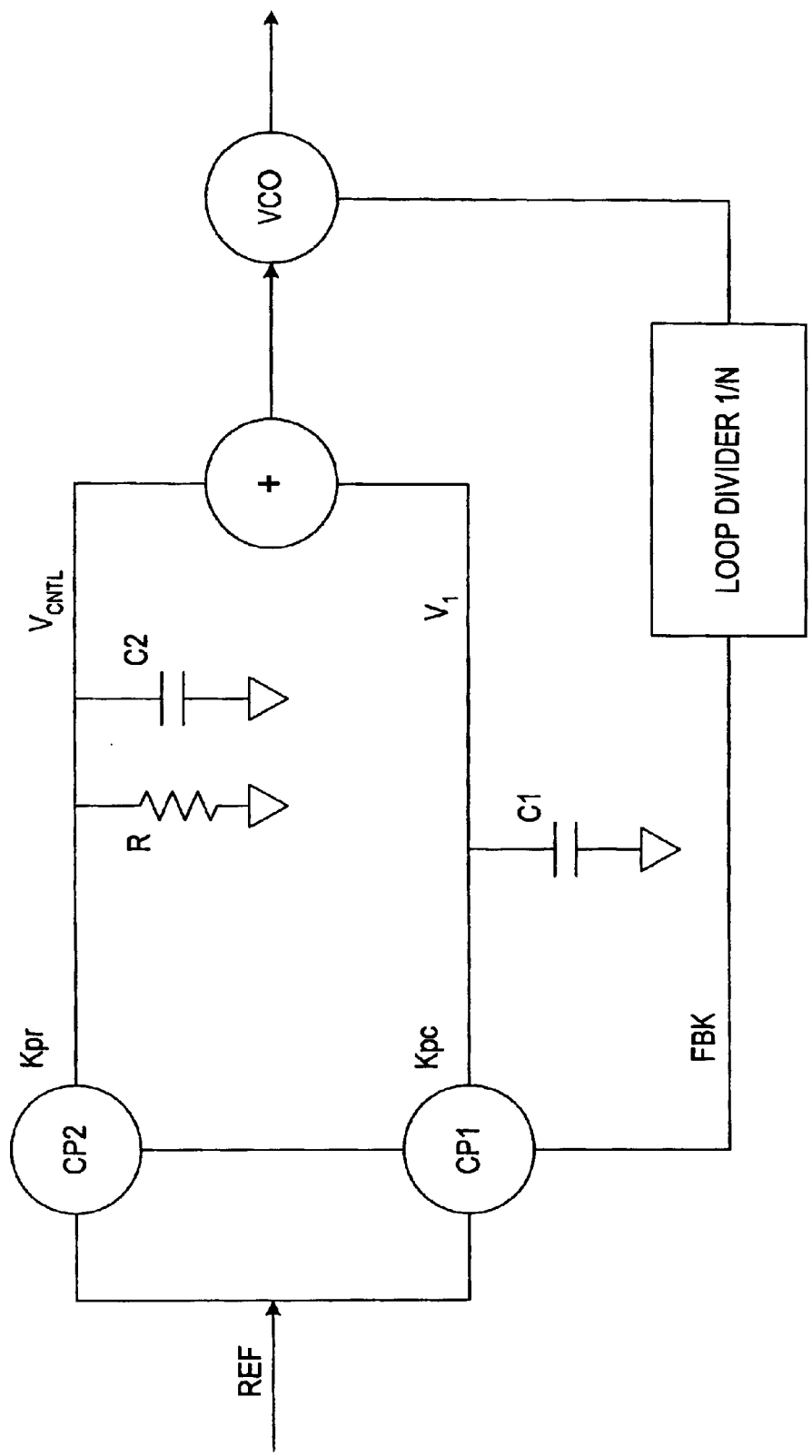
FIG. 4 is a diagram of a self-biased phase-locked loop circuit.
Figure 5:
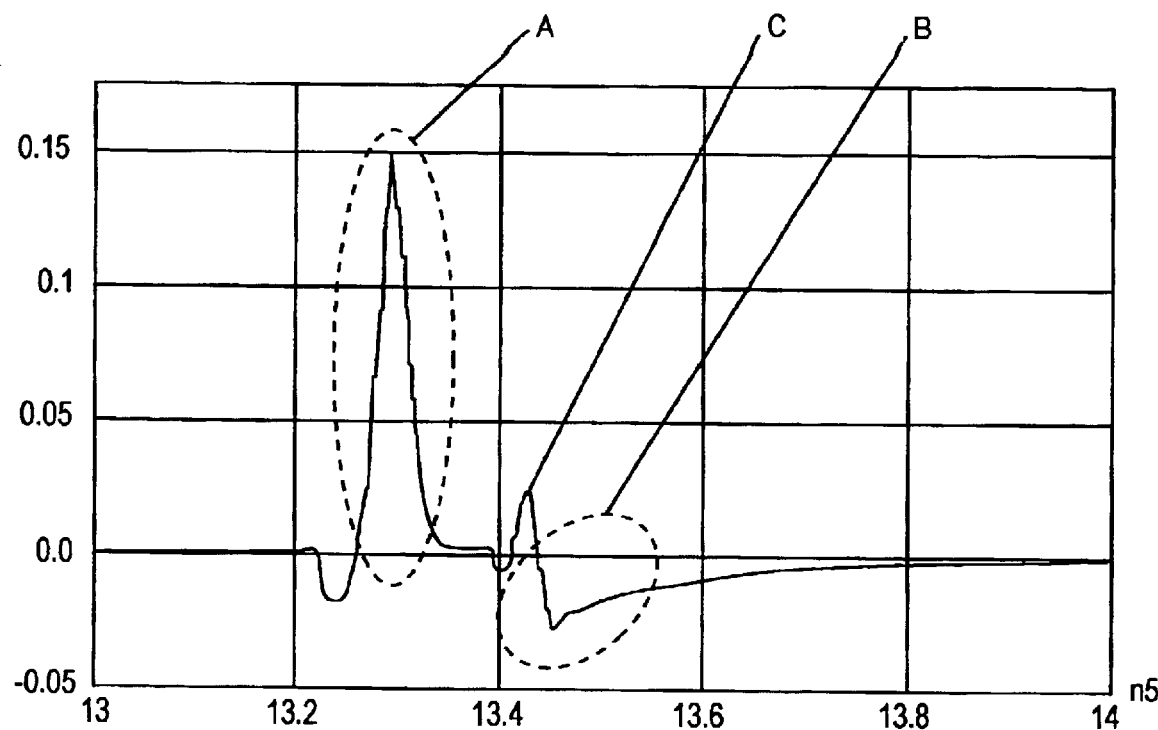
FIG. 5 is a graph showing a current signal output from the charge pump of FIG. 1 under conditions where there is zero phase error.

The charge pump of the present invention thus represents a significant improvement over conventional devices such as shown in FIG. 1. As previously discussed, the conventional charge pump switches its charge and pump circuits using signals having different amplitudes and slew rates. As a result, when a small phase error input into the phase-frequency detector, the charge circuit of this charge pump will not input current fast enough, thereby distorting operation of the PLL. Also, switching currents through parasitic capacitances will adversely affect the average charge pump current. These drawbacks are overcome by the charge pump of the present invention.

The charge pump of the present invention ensures that the charge circuit and the pump circuit are driven by signals which have the same amplitude and slew rate. As a result, the effect of switching currents is cancelled during one charge pump cycle, and this is especially beneficial when the charge pump is employed in a self-biased PLL.

Using switching controls (Up, Dn) with equal amplitudes and slew rates produces a number of additional advantages. For example, Up and Dn signals from the phase-frequency detector may be toggled between one another at a very fast rate. This allows the phase-frequency detector to work properly at much higher reference frequencies. Conventional charge pumps of the type shown in FIG. 1 are unable to achieve this rapid response because its charge circuit is switched using a slow slew rate signal.

Also, a charge pump constructed in accordance with the present invention will more efficiently dissipate currents through parasitic capacitances that flow to and from the loop filter as a result of switching the charge and pump circuits. The cancellation of parasitic switching currents can be explained for one charge pump cycle. Specifically, the switching current pulse that exists when the charge pump goes on equals (but is in an opposite direction to) the switching current pulse when the charge pump goes off. Thus, the average value of these two currents is zero. Switching in an opposite direction will therefore cause parasitic currents but in opposite directions, so the same amount of charge that was induced into the loop filter at the beginning of the pulse will be reduced from the loop filter at the end of the pulse. This results in cancelling the first switching effects.

Figure 9:
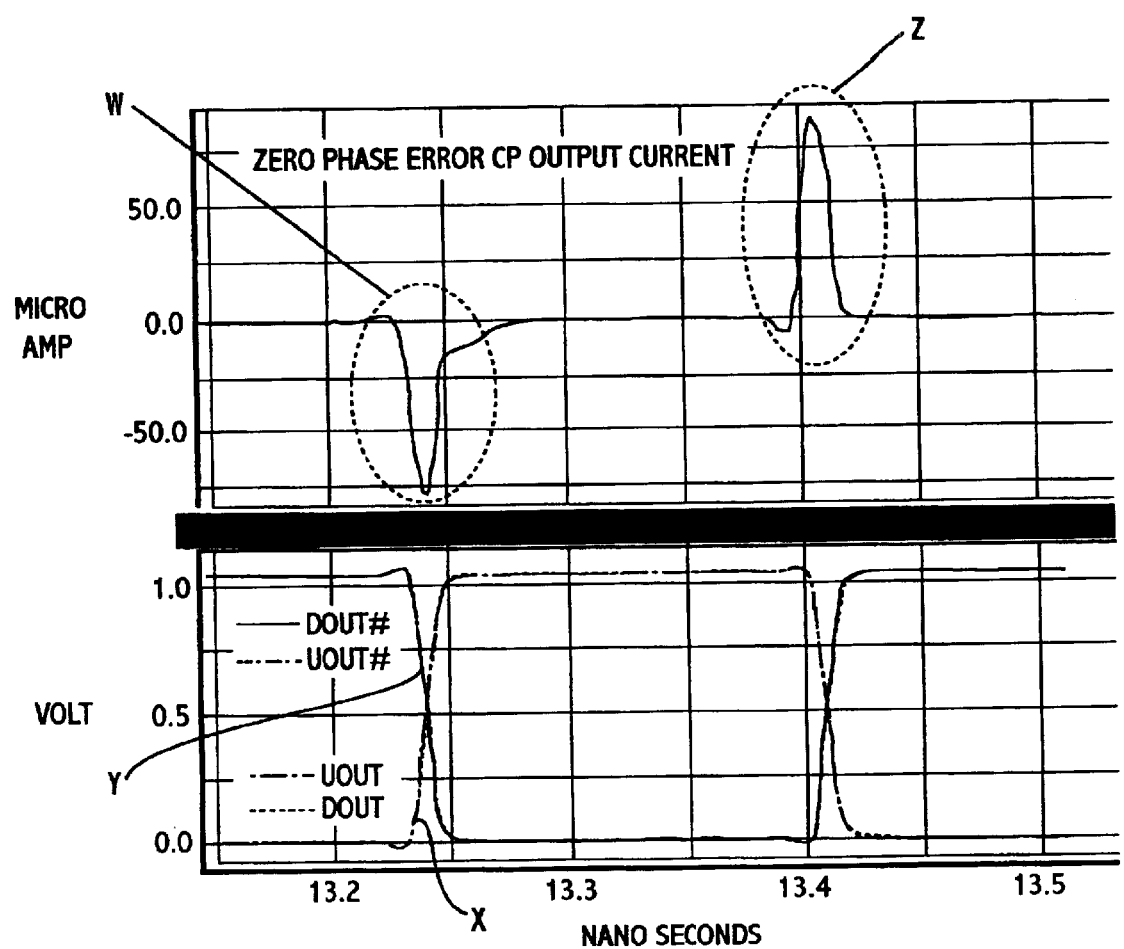
FIG. 9 is a graph showing a current signal output from the charge pump of FIG. 8 under conditions where there is zero phase error.

FIG. 9 is a graph showing output current generated by the charge pump of the present invention at zero phase error, along with the control signals which cause the charge pump to output these currents. Also, curve X correspond to both an Up control signal and a Down control signal. A single curve is shown for these signals because they perfectly overlap. Curve Y corresponds to overlapping complements of these signals. The names of the waves in the graph are UOUT and DOUT, since they correspond to outputs of the CMOS buffers.

In the graph, zero phase error behavior is reflected in an overlap mode of operation of the charge pump. In this mode, Up and Dn signals are toggled in the same direction (both from low to high, and then both from high to low). As can be seen, for most of the overlap period the output current zero (as in the ideal charge pump waveforms in FIG. 7). The switching currents (respectively shown in regions W and Z) are equal and opposite due to the equal amplitude and slew rate of the control signals and thus cancel each other. Because of this cancellation, the average current is zero, and in this embodiment this average zero current does not change with process, temperature, and operating point (and thus is no longer dependent upon the $V_{cntl}$ voltage) parameters. This is because the switching currents are at least substantially equal and therefore their effects cancel each other.

From the graph, it is also clear that the amplitude and duration of the switching current is much smaller than in the conventional case. As a result, the reference feed-through jitter is much smaller. The circuit of the present invention is able to substantially reduce overall DC skew variation. Experimental results show, for example, that a DC skew variation of 5 ps may be obtained with the present invention compared with 80 ps in conventional circuits. Also, reference feed-through jitter may be reduced from, for example, a value of 10 ps in conventional circuits to a value of 3 ps in accordance with the present invention.

Figure 10:
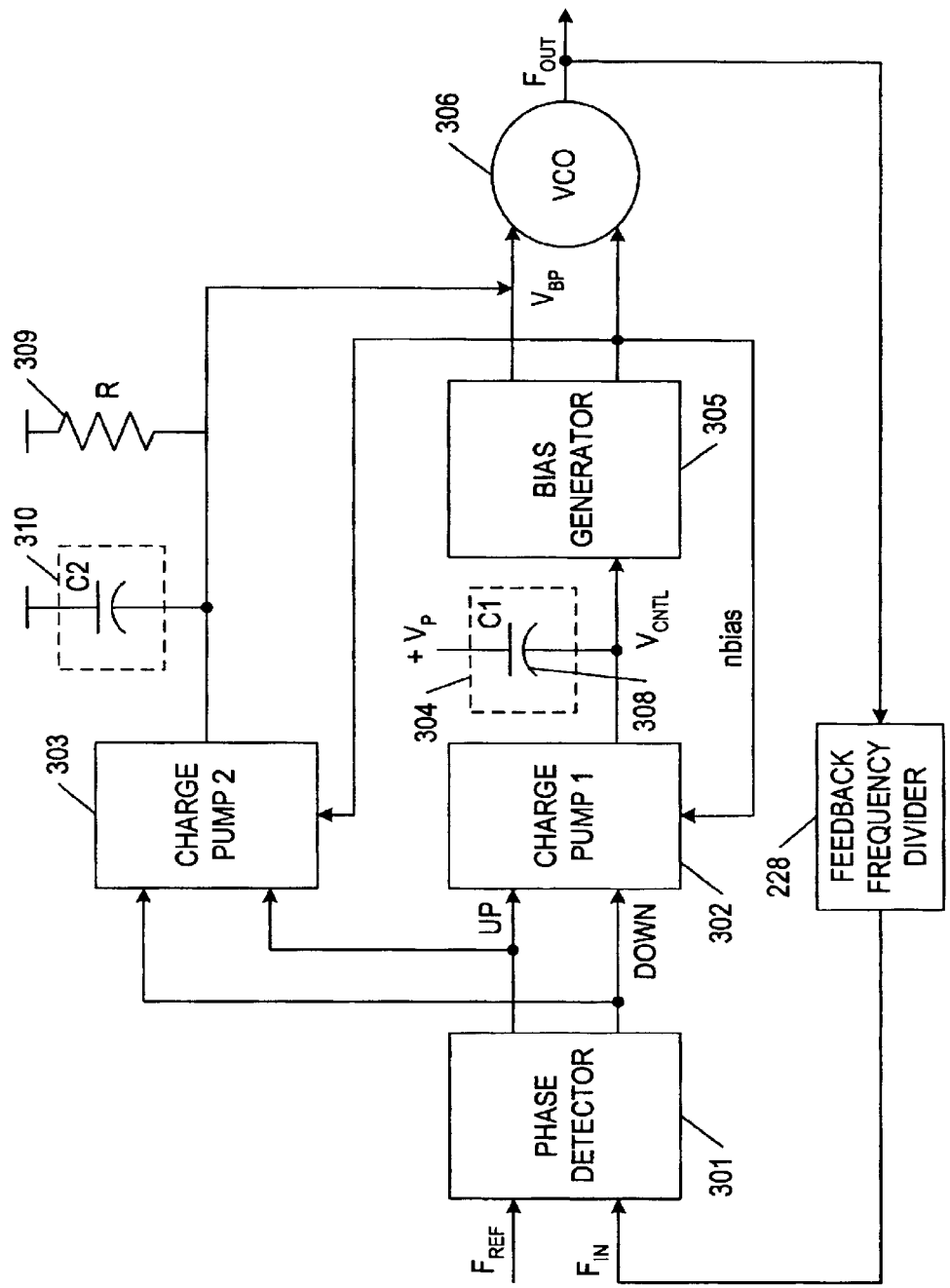
FIG. 10 is a diagram of a self-biased phase-locked loop constructed in accordance with one embodiment of the present invention.

FIG. 10 shows a self-biased phase-locked loop circuit in accordance with one embodiment of the present invention. This circuit includes a phase-frequency detector 301, first and second charge pumps 302 and 303, a loop filter 304 connected to the first charge pump, a bias generator 305 connected to the loop filter, and a voltage-controlled oscillator 306. The bias generator generates an nbias voltage based on the $V_1$ voltage. This nbias voltage is fed back to the charge pumps and also sets the bias of the voltage-controlled oscillator and charge pumps in order to bias the circuit based on predetermined current value. Also, both of the charge pumps may be constructed in accordance with the charge pump of the present invention previously described, and a divider 307 may be included along a feedback path if desired. The frequency divider may be, for example, a 1/N programmable divider.

In operation, the phase-frequency detector compares a reference frequency REF with a feedback signal FBK and outputs one of an Up signal and a Down signal based on the comparison. If the reference frequency leads the feedback frequency, an Up signal pulse may be applied to the charge pumps. Conversely, if the reference frequency lags the feedback frequency, a Down signal pulse may be applied. Of course, those skilled in the art can appreciate that the signals may be reversed depending upon whether the voltage-controlled oscillator has positive or negative gain. Also, the width of the Up pulse or Down pulse (whichever is applied) is proportional to the phase difference between REF and FBK.

The output of charge pump 302 is input into a capacitor 308 of the loop filter and the bias generator. The loop filter capacitor performs at least two functions. First, this capacitor integrates the current signal output from the first charge pump to produce a smooth control voltage (e.g., $V_1$) for the bias generator. The bias generator converts this voltage into a signal nbias which is fed back to the charge pumps and input into the voltage-controlled oscillator to set the PLL circuit to a desired bias. Such a bias may be set in accordance with any one of a variety of known techniques including but not limited to those disclosed in U.S. Pat. No. 6,329,882 assigned to Intel Corporation. Second, the loop filter capacitor functions as a low-pass filter for suppressing high-frequency noise. This filtering function is desirable because it provides stability to the operation of the PLL circuit.

The output of charge pump 303 is input into a resistor 309 and a second capacitor 310. The resistor may be implemented by transistors and its value dynamically adjusted based on the nbias voltage. Connecting the second capacitor in parallel with the resistor is advantageous because it serves to further reduce feed-through jitter.

Moreover, the capacitor prevents the control voltage for the voltage-controlled oscillator from changing too rapidly, by integrating the current pulses output from the second charge pump. The amplitude of the resultant voltage pulse at the VCO steering line is substantially reduced. As a result, the second charge pump becomes stable over time and output jitter performance is significantly enhanced. Also, it is noted that adding the second capacitor to the PLL changes the circuit from a second-order to a third-order phase-locked loop. The output of the bias generator is coupled with the VCNTRL output from the second charge pump, once having passed resistor 309 and capacitor 310, to control the VCO frequency in a manner that reduces or eliminates the differences between the reference and feedback frequencies input into the phase-and frequency detector.

In this self-biased PLL, the steady state phase error is determined by the first charge pump which is used to drive the loop filter capacitor. Self-jitter resulting from reference feed-through modulation is determined by the amount of voltage developed on the VCO steering line due to switching of the second charge pump. In an ideal charge pump, the voltage developed on the VCO steering line (VCNTRL) will be the product of the peak current of the second charge pump and the loop filter resistor filtered by the second capacitor.

Figure 11:
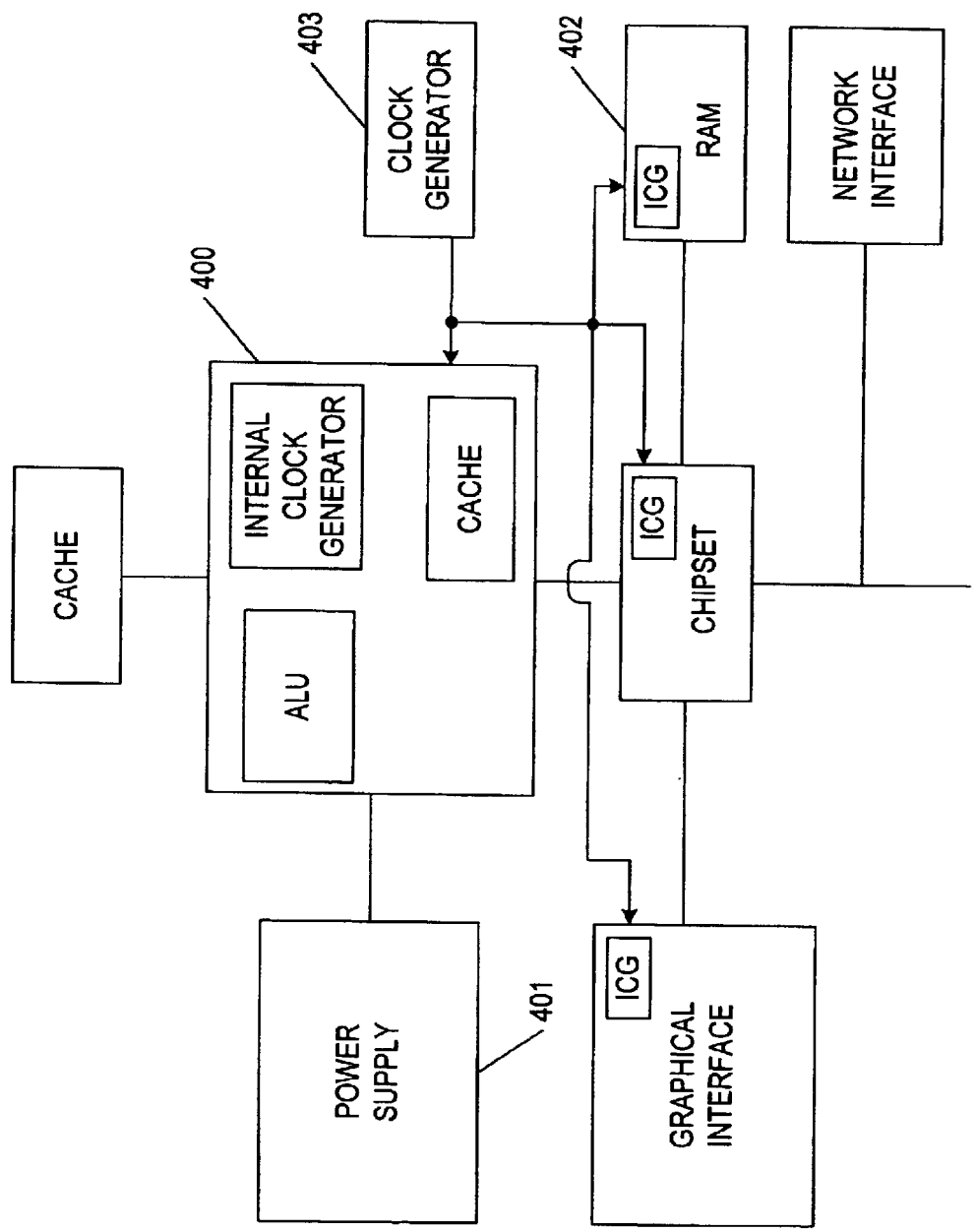
FIG. 11 is a diagram of processing system including a phase-locked loop equipped with a charge pump in accordance with the present invention.

FIG. 11 is a diagram of processing system in accordance with one embodiment of the present invention. The processing system includes a processing chip 400, a power supply 401, a memory 402, and a clock generator 403 which includes a phase-locked loop in accordance with the present invention. The phase-locked loop may be a self-biased PLL if desired. The processing chip may be a microprocessor, ASIC, or some other processor. Also, while the clock generator is shown as residing off-chip, those skilled in the art can appreciate that the clock generator may also be formed on-chip (internal clock generator) in order to reduce space and thus promote miniaturization. Usually, at system level, one clock generator may be used to perform synchronization between or among components. Each component may have its own internal clock generator, shown as (ICG) in FIG. 11.

The charge pump of the present invention produces a number of advantages when implemented, for example, in a self-biased PLL, as both of the charge pumps. The charge pump, for example, is able to produce a smaller and stable PLL steady state phase error. Experimental results show, for example, that the charge pump of the present invention is able to achieve a steady state phase error of 5 ps versus 80 ps in conventional circuits, assuming a worse case PVT and operating frequency. Also, the charge pump of the present invention produces low PLL self-jitter, in the neighborhood of 3 ps peak-to-peak compared with 10 ps peak-to-peak in conventional circuits.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. A charge pump, comprising:
    a charge circuit switch to allow current to pass from a first current source to an output node in response to a first control signal;
    a pump circuit switch to allow current to pass from the output node into a second current source in response to a second control signal; and
    a smoothing circuit to switch current into the second current source through a complementary output node when current from the first current source passes to the output node, and to switch current from the first current source through the complementary output node when current from the output node passes into the second current source, wherein the first control signal and the second control signal have at least a substantially same amplitude and slew rate.

2. The charge pump of claim 1, wherein the smoothing circuit switches current through a node of the charge circuit switch and switches current through a node of the pump circuit switch at a time when current is not being sourced to or sinked from the output node of the charge pump.

3. The charge pump of claim 1, further comprising:
    a first node coupled to the first current source, output node, and complementary output node; and
    a second node coupled to the second current source, output node, and complementary output node.

4. The charge pump of claim 3, wherein the first node is kept at a substantially constant voltage as a result of switching current from the first current source through the output and complementary output nodes, and wherein the second node is kept at a substantially constant voltage as a result of switching current into the second current source through the output and complementary output nodes.

5. The charge pump of claim 1, wherein the smoothing circuit switches current into the second current source through the complementary output node in response to a third control signal, and switches current from the first current source through the complementary output node in response to a fourth control signal.

6. The charge pump of claim 5, wherein the third control signal is a complement of the second control signal and the fourth control signal is a complement of the first control signal.

7. The charge pump of claim 1, further comprising:
    a current control circuit to switch current into and out of the complementary output node.

8. The charge pump of claim 7, wherein the current control circuit switches current into the complementary output node in response to the first control signal, and switches current from the complementary output node in response to the second control signal.

9. The charge pump of claim 7, wherein the current control circuit includes:
    a first switch which passes current from a third current source into the second current source through the complementary output node when current from the first current source passes to the output node; and
    a second switch which passes current from the first current source to a fourth current source through the complementary output node when current from the output node passes into the second current source.

10. The charge pump of claim 9, wherein the first and third current sources are a same current source and the second and fourth current sources are a same current source.

11. The charge pump of claim 9, wherein the first and third current sources are a same current source or the second and fourth current sources are a same current source.

12. The charge pump of claim 9, wherein the first control signal controls the first switch and the second control signal controls the second switch.

13. The charge pump of claim 9, further comprising:
a capacitor coupled between the complementary output node and a node between the first and second switches.

14. A charge pump device, comprising:
a charge circuit switch;
a pump circuit switch; and
a controller for generating a first control signal for switching the charge circuit switch and a second control signal for switching the pump circuit, wherein the first control signal and the second control signal have a same amplitude and slew rate, and the controller operates a current source coupled to the charge circuit switch and a current source coupled to the pump circuit switch during an OFF state of the charge pump, and wherein the controller directs current from the current source coupled to the charge circuit switch into the current source coupled to the pump circuit during said OFF state.

15. The charge pump device of claim 14, wherein the controller operates the current source of the charge circuit and the current source of the pump circuit for all states of operation of the charge pump.

16. A charge pump device comprising:
a charge circuit switch;
a pump circuit switch;
a controller for generating a first control signal for switching the charge circuit switch and a second control signal for switching the pump circuit; and
a dedicated switch which couples the first control signal and the second control signal to the charge circuit and the pump circuit, wherein the first control signal and the second control signal have a same amplitude and slew rate.

17. The charge pump device of claim 16, wherein the dedicated switch includes at least one buffer.

18. The charge pump device of claim 17, wherein the buffer is a CMOS buffer.

19. A charge pump, comprising:
a smoothing unit which controls a first current source to continuously output current and controls a second current source to continuously receive current during operation of the charge pump, wherein the controller includes:
a first switching circuit to switch current from the first current source to an output node of the charge pump during a charge mode and to switch current into the second current source through the output node during a pump mode; and
a second switching circuit to switch current from a third current source into the second current source during said charge mode, and to switch current from the first current source to a fourth current source during said pump mode.

20. The charge pump device of claim 19, wherein the smoothing circuit controls the first current source to continuously output current and controls the second current source to continuously receive current during each of a charge mode, a pump mode, an overlap mode, and an off mode of the charge pump.

21. The charge pump of claim 19, further comprising:
a filter for smoothing a bias voltage of at least one of the first and second current sources.

22. The charge pump of claim 19, wherein the second switching circuit switches current from the third current source during each of said charge mode, said pump mode, an overlap mode, and an off mode of the charge pump, and switches current into the fourth current source during each of said modes.

23. The charge pump of claim 19, wherein the first switching circuit includes:
a first switch coupled to the first current source;
a second switch coupled to the first current source and the first switch;
a third switch coupled to the second current source and the first switch; and
a fourth switch coupled to the second switch and the second current source, wherein an output node is located between the first and third switches.

24. The charge pump of claim 23, wherein the first and second switches are alternately switched, and wherein the third and fourth switches are alternately switched.

25. The charge pump of claim 24, wherein current passes from the first current source to the output node when the first switch is switched on and the third switch is switched off, and wherein current passes into the second current source through the output node when the third switch is switched on and the first switch is switched off.

26. The charge pump of claim 24, wherein switching currents used to alternately switch the first and second switches are of equal magnitude and opposite direction, and wherein switching currents used to alternately switch the third and fourth switches are of equal magnitude and opposite direction.

27. The charge pump of claim 19, wherein the first switching circuit switches current from the first current source to maintain at least a substantially constant voltage at a node located between the first current source and an output node of the charge pump, and switches current into the second current source to maintain at least a substantially constant voltage at a node located between the output node and the second current source.

28. The charge pump device of claim 19, wherein the first and third current sources are a same current source and the second and fourth current sources are a same current source.

29. The charge pump device of claim 19, wherein the first and third current sources are a same current source or the second and fourth current sources are a same current source.

30. A method for controlling a charge pump, comprising:
(a) controlling a charge circuit switch with a first control signal to output current from a first current source, wherein (a) includes switching current from the first current source to an output node of the charge pump during a charge mode and switching current from the first current source to a second current source during a pump mode; and
(b) controlling a pump circuit switch with a second control signal to cause current to flow into a third current source, wherein (b) includes switching current into the third current source from the output node during the pump mode and switching current from a fourth current source into the third current source during the charge mode, wherein the first control signal and the second control signal have a same amplitude and slew rate.

31. The method of claim 30, further comprising:

driving current from the first current source through a node of the charge circuit;

sinking current into the third current source from a node of the pump circuit, wherein the current from the first current source is driven through the node of the charge circuit and current is sinked into the third current source from the node of the pump circuit at a time when current is not being sourced to or sinked from the loop filter.

32. The method of claim 30, further comprising:

operating the first current source and the third current source during an OFF state of the charge pump.

33. The method of claim 30, further comprising:

operating the first current source and the third current source for all states of operation of the charge pump.

34. The method of claim 30, further comprising:

receiving the first control signal and the second control signal from a phase-frequency detector.

35. The method of claim 34, further comprising:

coupling the first control signal and the second control signal from the phase-frequency detector to the charge circuit and the pump circuit respectively.

36. The method of claim 35, wherein the first control signal and the second control signal are coupled by a dedicated switch that includes at least one buffer.

37. The method of claim 36, wherein the buffer is a CMOS buffer.

38. The method of claim 30, wherein the first and fourth current sources are a same current source and the second and third current sources are a same current source.

39. The method of claim 30, wherein the first and fourth current sources are a same current source or the second and third current sources are a same current source.

40. A method for controlling a charge pump, comprising:

controlling a charge circuit switch with a first control signal;

controlling a pump circuit switch with a second control signal; and directing current from the current source of the charge circuit to the current source of the pump circuit during said OFF state, wherein the first control signal and the second control signal have a same amplitude and slew rate.

41. A system, comprising:

a circuit; and an oscillator for generating clock signals for the circuit, said oscillator having a charge pump which includes:

(a) a charge circuit switch to allow current to pass from a first current source to an output node in response to a first control signal;

(b) a pump circuit switch to allow current to pass from the output node into a second current source in response to a second control signal; and, (c) a smoothing circuit to switch current into the second current source through a complementary output node when current from the first current source passes to the output node, and to switch current from the first current source through the complementary output node when current from the output node passes into the second current source, wherein the first control signal and the second control signal have at least a substantially same amplitude and slew rate.

42. The processing system of claim 41, wherein the smoothing circuit switches current into the second current source through the complementary output node in response to a third control signal, and switches current from the first current source through the complementary output node in response to a fourth control signal.

* * * * *